(12) United States Patent
Agarwal et al.

(10) Patent No.: US 9,653,320 B2
(45) Date of Patent: May 16, 2017

(54) METHODS FOR ETCHING A HARDMASK LAYER FOR AN INTERCONNECTION STRUCTURE FOR SEMICONDUCTOR APPLICATIONS

(71) Applicant: Applied Materials, Inc., Santa Clara, CA (US)

(72) Inventors: Sumit Agarwal, Dublin, CA (US); Chiu-pien Kuo, Zhubei (TW); Shang-Ting Hsieh, Taichung (TW); Guochuan Hong, Hsinchu (TW)

(73) Assignee: APPLIED MATERIALS, INC., Santa Clara, CA (US)

( * ) Notice: Subject to any disclaimer, the term of this patent is extended or adjusted under 35 U.S.C. 154(b) by 35 days.

(21) Appl. No.: 14/495,728

(22) Filed: Sep. 24, 2014

(65) Prior Publication Data

US 2016/0079077 A1    Mar. 17, 2016

Related U.S. Application Data

(63) Continuation-in-part of application No. 14/485,346, filed on Sep. 12, 2014, now abandoned.

(51) Int. Cl.
*H01L 21/311* (2006.01)
*H01L 21/3213* (2006.01)
*H01L 23/532* (2006.01)

(52) U.S. Cl.
CPC .. *H01L 21/32139* (2013.01); *H01L 21/32136* (2013.01); *H01L 21/32138* (2013.01); *H01L 23/53238* (2013.01); *H01L 2924/0002* (2013.01)

(58) Field of Classification Search
CPC .................. H01L 21/32138; H01L 21/32139

USPC .................................................. 438/618, 734
See application file for complete search history.

(56) References Cited

U.S. PATENT DOCUMENTS

| | | | |
|---|---|---|---|
| 6,271,148 B1 * | 8/2001 | Kao | C23C 16/4405 216/69 |
| 6,300,202 B1 | 10/2001 | Hobbs et al. | |
| 6,319,730 B1 | 11/2001 | Ramdani et al. | |
| 6,323,143 B1 | 11/2001 | Yu | |
| 6,326,261 B1 | 12/2001 | Tsang et al. | |
| 6,348,386 B1 | 2/2002 | Gilmer | |
| 6,855,643 B2 | 2/2005 | Nallan et al. | |
| 7,691,749 B2 | 4/2010 | Levy et al. | |
| 2002/0072016 A1 * | 6/2002 | Chen | G03F 7/427 430/323 |

(Continued)

*Primary Examiner* — Kimberly Rizkallah
*Assistant Examiner* — Maria Ligai
(74) *Attorney, Agent, or Firm* — Patterson + Sheridan, LLP (57) ABSTRACT

Embodiments of the present disclosure provide methods for patterning a hardmask layer disposed on a metal layer, such as a copper layer, to form an interconnection structure in semiconductor devices. In one embodiment, a method of patterning a hardmask layer on a metal layer disposed on a substrate includes supplying a first etching gas mixture comprising a carbon-fluorine containing gas and a chlorine containing gas into a processing chamber to etch a portion of a hardmask layer disposed on a metal layer formed on a substrate, supplying a second etching gas mixture comprising a hydrocarbon gas into the processing chamber to clean the substrate, and supplying a third etching gas mixture comprising a carbon-fluorine containing gas to remove a remaining portion of the hardmask layer until a surface of the metal layer is exposed.

19 Claims, 3 Drawing Sheets

(56) References Cited

U.S. PATENT DOCUMENTS

| | | | |
|---|---|---|---|
| 2007/0199922 A1* | 8/2007 | Shen | H01L 21/32137 216/76 |
| 2008/0160210 A1 | 7/2008 | Yang et al. | |
| 2008/0268645 A1 | 10/2008 | Kao et al. | |
| 2009/0104782 A1 | 4/2009 | Lu et al. | |
| 2009/0211596 A1* | 8/2009 | Yun | H01L 21/6708 134/6 |
| 2010/0018460 A1 | 1/2010 | Singh et al. | |
| 2010/0200993 A1 | 8/2010 | Cui et al. | |
| 2011/0303639 A1* | 12/2011 | Ng | G03F 7/091 216/41 |

* cited by examiner

METHODS FOR ETCHING A HARDMASK LAYER FOR AN INTERCONNECTION STRUCTURE FOR SEMICONDUCTOR APPLICATIONS

CROSS-REFERENCE TO RELATED APPLICATION

This application is a continuation-in-part of U.S. patent application Ser. No. 14/485,346, filed Sep. 12, 2014 (APPM/ 22159), which is hereby incorporated by reference in its entirety.

BACKGROUND

Field

Embodiments of the present disclosure generally relate to methods of patterning a hardmask layer, and more particularly to methods of patterning a hardmask layer disposed on a metal material utilized to form interconnection structures in semiconductor applications.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-50 nm scale, it is necessary to use low resistivity conductive materials (e.g., copper) as well as low dielectric constant insulating materials (dielectric constant less than about 4) to obtain suitable electrical performance from such components.

The demands for greater integrated circuit densities also impose demands on the process sequences used in the manufacture of integrated circuit components. As the physical dimensions of the structures used to form semiconductor devices are pushed against technology limits, the process of accurate pattern transfer for structures that have small critical dimensions and high aspect ratios has become increasingly difficult. Copper is commonly used to form interconnects a sub-micron device nodes due to its low resistivity compared to aluminum. Copper interconnects are electrically isolated from each other by an insulating material. When the distance between adjacent metal interconnects and/or thickness of the insulating material has sub-micron dimensions, capacitive coupling may potentially occur between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low-k) insulating materials (e.g. dielectric constants less than about 4.0) are needed.

Copper interconnect systems are typically fabricated using a damascene process in which trenches and vias are etched into dielectric layers. The trenches and vias are filled with copper, which is then planarized using, for example, a chemical-mechanical planarization (CMP) process. However, several disadvantages associated with copper damascene structure have become severe concerns as feature sizes continue to decrease. For example, small feature size of the metal lines generally requires higher aspect ratios, which adversely increases the difficulty in filling such features to form void free metal structures. Forming a barrier layer within high aspect features is particularly difficult. Furthermore, as feature sizes continue to decrease, the barrier layer cannot scale, thus resulting in the barrier layer becoming a greater fraction of that particular feature. Additionally, as the feature dimensions become comparable to the bulk mean free path, the effective resistivity of copper features will increase because of non-negligible electron scattering at the copper-barrier interface and at grain boundaries.

Accordingly, an alternate metal patterning using subtractive metal etching process has recently gained wide attention. A dry plasma etching process is performed to pattern the metal materials to form one or more patterns in the interconnect structure. However, current dry plasma etching processes are primarily performed by physical sputtering which results in low selectivity between the metal layer and the hardmask layer utilized during the etching process. Typically, the hardmask layer is patterned to remove a portion of the hardmask layer to expose the underlying metal layer for etching to form the interconnection structure. Conventional processes for patterning the hardmask layer over a metal layer often have poor etching stop control and low selectivity, thereby damaging the metal structure disposed under the hardmask layer. Additionally, as the hardmask layer may sometimes be fabricated from a metal containing material, which may have similar material properties to the metal layer disposed underneath, accurate control of the etch stopping point and etch selectivity becomes increasingly challenging. Additionally, selectivity to patterning layer (typically carbon based with or without Si additives) used to etch into the hardmask is becoming increasingly challenging. Furthermore, traditional methods for etch a hardmask layer utilizes aggressive halogen chemistries or oxidizing chemistries, which contaminate the nearby metal layer and may lead to non-volatile by-product formation, adversely passivating the metal surface and making it difficult to pattern the metal layer in the subsequent processes.

Furthermore, by-products generated during the hardmask etching process are often re-deposited on the sidewalls, resulting in tapered profiles, feature deformation and line width increase.

Thus, there is a need for improved methods for patterning a hardmask layer, especially the hardmask layer disposed on a metal layer, in an interconnection structure with improved process control to form accurate and desirable interconnection structures for semiconductor devices.

SUMMARY

Embodiments of the present disclosure provide methods for patterning a hardmask layer disposed on a metal layer, such as a copper layer, to form an interconnection structure in semiconductor devices. In one embodiment, a method of patterning a hardmask layer disposed on a metal layer formed on a substrate includes supplying a first etching gas mixture comprising a carbon-fluorine containing gas and a chlorine containing gas into a processing chamber to etch a portion of a hardmask layer disposed on the metal layer, supplying a second etching gas mixture comprising a hydrocarbon gas into the processing chamber to clean the substrate, and supplying a third etching gas mixture comprising a carbon-fluorine containing gas to remove a remaining portion of the hardmask layer until a surface of the metal layer is exposed.

In another embodiment, a method of patterning a hardmask layer disposed on a metal layer formed on a substrate includes performing an etching break-through process to etch a feature in a hardmask layer disposed on the metal layer, wherein the feature is etched into the hardmask layer to a depth between about 50 percent and about 90 percent of a total thickness of the hardmask layer, wherein the hardmask layer is a Ta containing material or a Ti containing material, wherein the hardmask layer is etched by a chlorine free carbon-fluorine containing gas, performing a flash cleaning process to remove etching residuals from the substrate, and performing an interface cleaning process to etch a remaining portion of the hardmask layer from the substrate to expose the feature to the metal layer, wherein the interface cleaning process is performed by supplying an etching gas mixture including a hydrogen free carbon-fluorine containing gas.

In yet another embodiment, a method of patterning a hardmask layer on a metal layer disposed on a substrate includes performing an etching break-through process by supplying a first gas mixture to etch a feature into a hardmask layer disposed on a metal layer formed on the substrate, wherein the feature is etched to a depth between about 50 percent and about 90 percent of a total thickness of the hardmask layer, the first gas mixture including a carbon-fluorine containing gas and a chlorine containing gas, performing a flash cleaning process to remove etching residuals from the substrate by supplying a second gas mixture including a hydrocarbon gas, and performing an interface cleaning process to etch a remaining portion of the hardmask layer from the substrate to expose the feature to the metal layer by supplying a third etching gas mixture including a hydrogen free carbon-fluorine containing gas while maintaining the substrate temperature at about 90 degrees Celsius.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for patterning a hardmask layer on a substrate to form features in the hardmask layer to expose a portion of a metal layer disposed under the hardmask layer for manufacturing an interconnection structure for semiconductor devices. In one embodiment, the patterning process is a dry etching process that utilizes a three-stage etching process to etch the hardmask layer as well as removing etching by-products generated during the etching process. The three-stage etching process includes a first stage of a breaking-through process to initially etch a top portion of the hardmask layer. Subsequently, a second stage of a flash cleaning process is performed to remove etching by-product or surface residuals to clean out the surface of the hardmask layer for further etching. Finally, a third stage of a bulk etching process is then performed to etch through the hardmask layer to form features in the hardmask layer, exposing a portion of the metal layer disposed under the hardmask layer for manufacturing an interconnection structure. By utilizing the three-stage hardmask patterning process, an accurate control of etching selectivity and etching stop point may be obtained to provide a good profile control of the features formed in the hardmask layer. In addition, it prevents the exposure of metal layer to the aggressive chemicals that may be used in the first step of the etching process.

Figure 1:
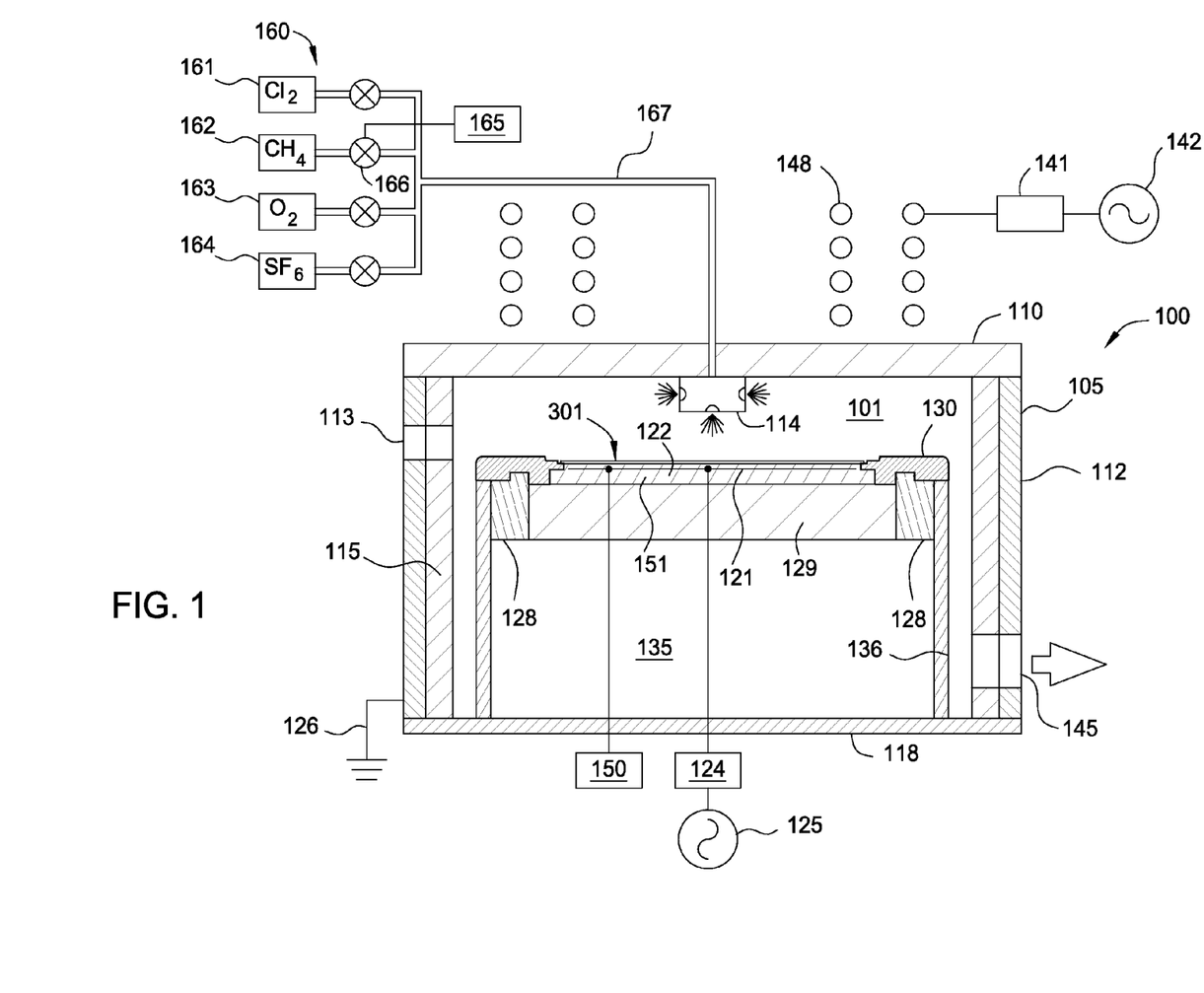
FIG. 1 depicts an apparatus utilized to pattern a metal layer formed on a substrate to manufacture an interconnection structure.

FIG. 1 is a simplified cutaway view for an exemplary etch processing chamber 100 for etching a metal layer. The exemplary etch processing chamber 100 is suitable for removing one or more film layers from the substrate 301. One example of the process chamber that may be adapted to benefit from the disclosure is an AdvantEdge Mesa Etch processing chamber, available from Applied Materials, Inc., located in Santa Clara, Calif. It is contemplated that other process chambers, including those from other manufactures, may be adapted to practice embodiments of the disclosure.

The etch processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the etch processing chamber 100. The dimensions of the chamber body 105 and related components of the etch processing chamber 100 are not limited and generally are proportionally larger than the size of the substrate 301 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 301 into and out of the etch processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen (N2), helium (He) and oxygen gas ($O_2$). Additionally, process gasses may include chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $CO_2$, $SO_2$, CO, and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the etch processing chamber 100, the gases are energized to form plasma. An antenna 148, such as one or more inductor coils, may be provided adjacent to the etch processing chamber 100. An antenna power supply 142 may power the antenna 148 through a match circuit 141 to inductively couple energy, such as RF energy, to the process gas to maintain a plasma formed from the process gas in the chamber volume 101 of the etch processing chamber 100. Alternatively, or in addition to the antenna power supply 142, process electrodes below the substrate 301 and/or above the substrate 301 may be used to capacitively couple RF power to the process gases to maintain the plasma within the chamber volume 101. The operation of the power supply 142 may be controlled by a controller, such as controller 165, that also controls the operation of other components in the etch processing chamber 100.

A substrate support pedestal 135 is disposed in the chamber volume 101 to support the substrate 301 during processing. The support pedestal 135 may include an electrostatic chuck 122 for holding the substrate 301 during processing. The electrostatic chuck (ESC) 122 uses the electrostatic attraction to hold the substrate 301 to the substrate support pedestal 135. The ESC 122 is powered by an RF power supply 125 integrated with a match circuit 124. The ESC 122 comprises an electrode 121 embedded within a dielectric body. The electrode 121 is coupled to the RF power supply 125 and provides a bias which attracts plasma ions, formed by the process gases in the chamber volume 101, to the ESC 122 and substrate 301 positioned thereon. The RF power supply 125 may cycle on and off, or pulse, during processing of the substrate 301. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the etch processing chamber 100.

Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 301.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 301 disposed thereon. The ESC 122 is configured to perform in the temperature range required by the thermal budget of the device being fabricated on the substrate 301. For example, the ESC 122 may be configured to maintain the substrate 301 at a temperature of about minus about 25 degrees Celsius to about 500 degrees Celsius for certain embodiments.

The cooling base 129 is provided to assist in controlling the temperature of the substrate 301. To mitigate process drift and time, the temperature of the substrate 301 may be maintained substantially constant by the cooling base 129 throughout the time the substrate 301 is in the etch chamber. In one embodiment, the temperature of the substrate 301 is maintained throughout subsequent etch processes at about 70 to 90 degrees Celsius.

A cover ring 130 is disposed on the ESC 122 and along the periphery of the substrate support pedestal 135. The cover ring 130 is configured to confine etching gases to a desired portion of the exposed top surface of the substrate 301, while shielding the top surface of the substrate support pedestal 135 from the plasma environment inside the etch processing chamber 100. Lift pins (not shown) are selectively moved through the substrate support pedestal 135 to lift the substrate 301 above the substrate support pedestal 135 to facilitate access to the substrate 301 by a transfer robot (not shown) or other suitable transfer mechanism.

The controller 165 may be utilized to control the process sequence, regulating the gas flows from the gas panel 160 into the etch processing chamber 100 and other process parameters. Software routines, when executed by the CPU, transform the CPU into a specific purpose computer (controller) that controls the etch processing chamber 100 such that the processes are performed in accordance with the present disclosure. The software routines may also be stored and/or executed by a second controller (not shown) that is collocated with the etch processing chamber 100.

The substrate 301 has various film layers disposed thereon which may include at least one metal layer and a hardmask layer disposed on the metal layer. The various film layers may require etch recipes which are unique for the different compositions of the other film layers in the substrate 301. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, etch processing chamber 100 is configured to at least etch a hardmask layer disposed on a metal layer to form an interconnection structure. For processing parameters provided herein, the etch processing chamber 100 is configured to process a 300 mm diameter substrate, i.e., a substrate having a plan area of about 0.0707 $m^2$, or a 450 mm diameter substrate. The process parameters, such as flow and power, may generally be scaled proportionally with the change in the chamber volume or substrate plan area.

Figure 2:
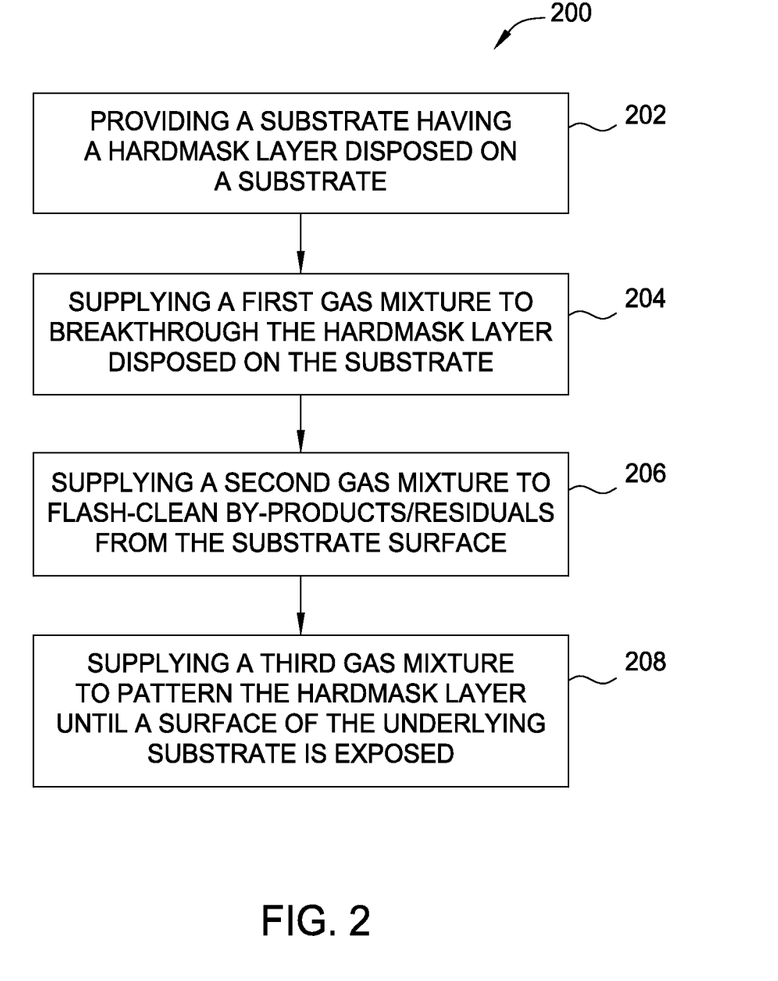
FIG. 2 depicts a flow diagram of a method for patterning a hardmask layer to form features into the metal layer to manufacture an interconnection structure.

FIG. 2 is a flow diagram of one embodiment of a method 200 for patterning a hardmask layer disposed on a metal layer, such as a copper layer, for manufacturing an interconnection structure for semiconductor devices. The patterning method 200 may be performed in a processing chamber, such as the processing chamber 100 depicted in FIG. 1, or other suitable processing chamber. FIGS. 3A-3D are schematic cross-sectional views illustrating a sequence for etching a hardmask layer disposed on a metal layer disposed on a substrate according to the method 200. Although the method 200 is described below with reference to a substrate having a hardmask layer disposed on a metal layer utilized to form an interconnection structure, the method 200 may also be used to advantage in other transistor device manufacturing applications, among others.

The method 200 begins at block 202 by transferring a substrate, such as the substrate 301, into a processing chamber, such as the processing chamber 100 in FIG. 1. The substrate 301 may be a silicon based material or any suitable insulating materials or conductive materials as needed, having a hardmask layer 305 disposed on a metal layer 304 formed on the substrate 301 that may be utilized to form an interconnection structure 302, as shown in FIG. 3A.

Figure 3A:
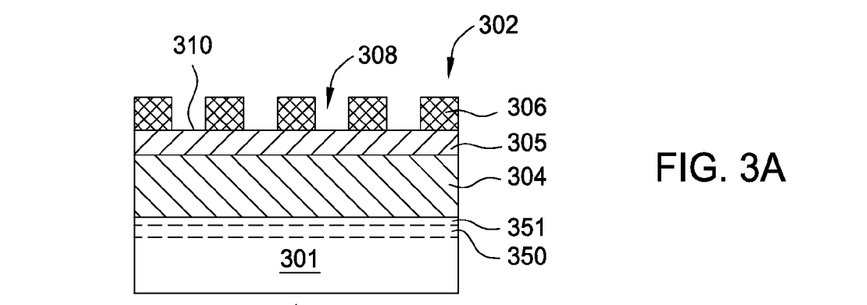
FIG. 3A-3D depict one embodiment of a sequence for patterning a hardmask layer to form features into the hardmask layer to manufacture an interconnection structure in accordance with the embodiment depicted in FIG. 2.

As shown in the exemplary embodiment depicted in FIG. 3A, the substrate 301 may have a substantially planar surface, an uneven surface, or a substantially planar surface having a structure formed thereon. In one embodiment, the substrate 301 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 301 may have various dimensions, such as 200 mm, 300 mm, 450 mm or other diameter wafers, as well as, rectangular or square panels. Unless otherwise noted, embodiments and examples described herein are conducted on substrates with a 300 mm diameter. In the embodiment wherein a SOI structure is utilized for the substrate 301, the substrate 301 may include a buried dielectric layer disposed on a silicon crystalline substrate. In the embodiment depicted herein, the substrate 301 may be a crystalline silicon substrate.

In one particular embodiment, the substrate 301 may have a barrier layer 351 disposed between the metal layer 304 and a low-k insulating dielectric material 350, as shown in dotted line in FIG. 3A. The barrier layer 351 may be fabricated from TaN, TiN, AlN, TaSiN, TiSiN, SiN, SiON, SiC, SiNC, SiOC or other suitable materials. Suitable examples of the low-k insulating dielectric material that can be used as the barrier layer 351 includes SiO containing materials, SiN containing materials, SiOC containing materials, SiC containing materials, carbon based materials, or other suitable materials.

In one embodiment, the metal layer 304 is disposed on the substrate 301. The metal layer 304 may be fabricated from tungsten (W), tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, and combinations thereof, among others. In the embodiment depicted in FIGS. 3A-3D, the metal layer 304 is a copper layer or a copper alloy layer having a thickness between about 200 Å and about 500 Å, such as about 350 Å.

The hardmask layer 305 is disposed on the metal layer 304 to facilitate transferring features into the metal layer 304. The hardmask layer 305 may be fabricated from Ta containing materials, such as Ta, TaN, TaSiN, a Ti containing materials, such as Ti, TiN, TiSiN, aluminum containing materials, such as AlN, $AlO_3$, AlON, alloys thereof and combinations thereof, among others. In the embodiment depicted in FIGS. 3A-3D, the hardmask layer 305 is a Ta containing material or a Ti containing material having a thickness between about 100 Å and about 400 Å, such as 150 Å and about 300 Å.

A patterned mask layer 306 may be formed over the hardmask layer 305, having openings 308 formed in the patterned mask layer 306 exposing portions 310 of the hardmask layer 305 for etching. In one embodiment, the patterned mask layer 306 may include a photoresist layer disposed on a dielectric film material. Suitable examples of the photoresist layer includes a positive tone photoresist, a negative tone photoresist, a UV lithography photoresist, an i-line photoresist, an e-beam resist (for example, a chemically amplified resist (CAR)) or other suitable photoresist. In some embodiments wherein the photoresist layer may be partially or entirely consumed during the previous patterning processes, the patterned mask layer 306 may only include the remaining dielectric film material.

The film material comprising the patterned mask layer 306 may be a single layer of dielectric material, composite layers of dielectric materials, or a film stack with different types of material including metal containing layer, dielectric materials and organic materials. Suitable examples of the patterned mask layer 306 include an ARC layer disposed on a dielectric layer. The ARC layer and the dielectric layer may be fabricated from silicon oxide, silicon oxynitride, silicon carbide, amorphous carbon, silicon carbon-nitride (SiCN), and the like. In one embodiment, the patterned mask layer 306 may include an ARC layer fabricated from a SiON layer disposed on a dielectric layer fabricated from an amorphous carbon layer.

Figure 3B:
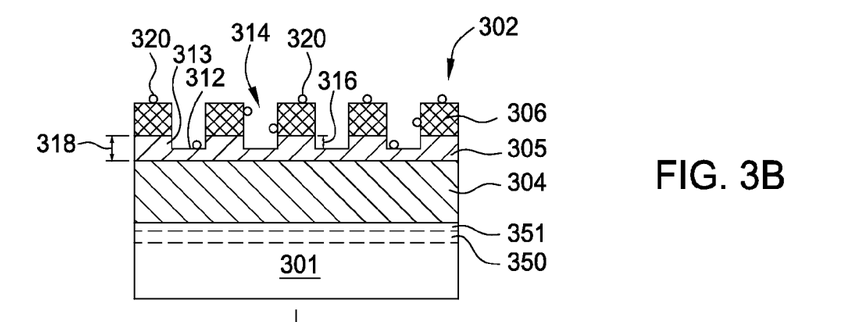

At block 204, a first etching gas mixture is supplied into the processing chamber 100 to perform an etching breakthrough process. The etching breakthrough process etches a top portion 313 of the hardmask layer 305 exposed by the patterned mask layer 306, as shown in FIG. 3B, until a predetermined depth 316 of a feature 314 is formed in the hardmask layer 305. The patterned mask layer 306 serves as an etching mask during the etching process of the hardmask layer 305. The first etching gas mixture is continuously supplied to etch the hardmask layer 305 until the depth 316 of the feature 314 is formed in the hardmask layer 305. In one embodiment, the depth 316 may be between about 50 Å and about 200 Å. Alternately, the depth 316 may be greater than 50 percent, for example, between about 50 percent and about 90 percent, such as about 75 percent, of a total thickness 318 of the hardmask layer 305.

During the etching process, etching by-products 320 may be adversely accumulated or adhered on surfaces of the patterned mask layer 306. Accordingly a flash cleaning process, which will be described later at block 206 utilizing a second etching gas mixture, may be utilized to maintain cleanness of the substrate surface to continue etching the hardmask layer 305 with desired and accurate profile transfer and to remove aggressive chemicals used in the etching breakthrough process.

In one embodiment, the first etching gas mixture selected to etch the hardmask layer 305 includes at least a carbon-fluorine containing gas and optionally a chlorine containing gas. The carbon-fluorine containing gas has a formula $C_xH_yF_z$, wherein x, y and z are integers ranging from 1 to 8, 0 to 18, and 2 to 16, respectively. Suitable examples of the carbon-fluorine containing gas include $CFH_3$, $CF_2H_2$, $CF_3H$, $C_2F_2H_4$, $C_2F_2H_6$, $CF_4$, $C_2F_6$, and the like. In one example, the carbon-fluorine containing gas is a chlorine free carbon-fluorine containing gas. Suitable examples of the chlorine containing gas include $Cl_2$, HCl, and the like. In a particular embodiment, the carbon-fluorine containing gas is $CF_3H$ and the chlorine containing gas is $Cl_2$. In another particular embodiment, the carbon-fluorine containing gas includes a gas mixture of $CF_3H$ and $CF_4$.

It is believed that the carbon-fluorine containing gas and the optional chlorine containing gas may efficiently react with metal atoms, such as Ta or Ti elements, from the hardmask layer 305, forming by-products in gas phase or in a solid matrix that can be easily removed from the substrate surface. The combination of the carbon-fluorine containing gas and the chlorine containing gas, when presented, supplied in the first gas mixture forms an aggressive etchants to remove most of the hardmask layer 305, for example greater than 50 percent of the depth 316 of the total thickness 318 of the hardmask layer 305. The first etching gas mixture is continuously supplied to etch the hardmask layer 305 without exposing the underlying metal layer 304. The metal elements from the hardmask layer 305 react with the aggressive etchants from the plasma, forming etching by-products 320 may be a metal containing fluorine-carbon complex in a gas phase which is readily pumped out of the processing chamber or in solid matrix which readily falls on the substrate surface or feature sidewalls.

While supplying the first etching gas mixture, an inert gas may also be supplied into the etching gas mixture to assist the profile control as needed. Examples of the inert gas supplied in the gas mixture include Ar, He, Ne, Kr, Xe or the like.

In one embodiment, the carbon-fluorine containing gas supplied in the first etching gas mixture may be maintained at a flow rate by volume between about 5 sccm and about 500 sccm, such as about 10 sccm and about 120 sccm. The chlorine containing gas supplied in the first etching gas mixture may be maintained at a flow rate by volume between about 5 sccm and about 100 sccm, such as about 20 sccm and about 40 sccm. The optional inert gas may be supplied to the processing chamber at a flow rate by volume between about 30 sccm and about 200 sccm.

After the first etching gas mixture is supplied to the processing chamber mixture, RF source power is supplied to form a plasma from the first etching gas mixture therein. The RF source power may be supplied between about 500 Watts and about 2000 Watts and at a frequency between about 400 kHz and about 13.56 MHz. A RF bias power may also be supplied as needed. The RF bias power may be supplied at less than 200 Watts, between about 30 Watts and about 160 Watts, to maintain minimum bias bombardment impact to the substrate. In one embodiment, the RF source power may be pulsed with a duty cycle between about 10 to about 95 percent at a RF frequency between about 500 Hz and about 10 kHz.

Several process parameters may also be controlled while supplying the etching gas mixture to perform the etching process. The pressure of the processing chamber may be controlled at between about 0.5 milliTorr and about 500 milliTorr, such as between about 4 milliTorr and about 30 milliTorr. A substrate temperature is maintained between about 15 degrees Celsius to about 300 degrees Celsius, between about 5 degrees Celsius and about 100 degrees Celsius, for example about 90 degree Celsius. The first etching gas mixture for performing the etching process may be performed for between about 10 seconds and about 30 seconds to etch the hardmask layer 305 with the depth 316 for between about 30 Å and about 150 Å. Alternatively, the etching process may remove between about 60 percent and about 80 percent of the thickness of the hardmask layer 305 from the substrate 301.

Figure 3C:
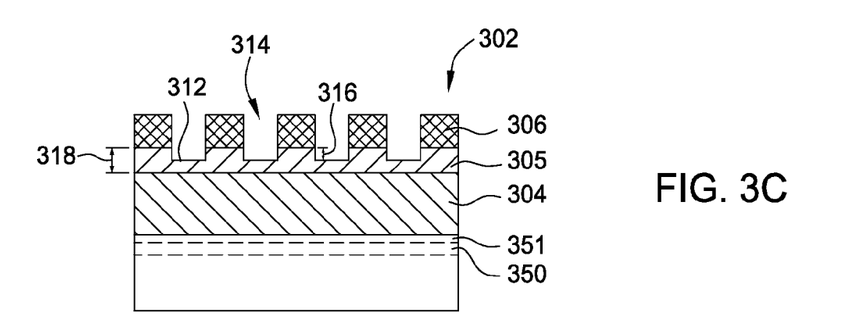

At block 206, a flash cleaning process may be performed to remove the etching by-products 320 and/or other related compounds from the substrate, as shown in FIG. 3C. During etching of the hardmask layer 305 at block 204, etching by-products 320, such as a fluorine-carbon complex, which are not formed in a gas phase that can be readily pumped out from the processing chamber, may be in the form of a solid precipitate disposed on the substrate surface. As the etching by-product 320 and/or other related compounds has accumulated on the surface of the substrate 301, the features 314 being formed in the hardmask layer 305 may be deformed and distorted. Accordingly, the flash cleaning process may be performed at block 206 to efficiently remove the etching by-products 320 and/or other related compounds from the surface of the substrate 301.

In one embodiment, the flash cleaning process may be performed by supplying a second gas mixture into the processing chamber. The flash cleaning process may have the second gas mixture supplied into the processing chamber for a first period of time without RF source or RF bias power applied. After the first period of time, then the RF source and RF bias power may then be applied to form a plasma in the second gas mixture for a second period of time.

In one embodiment, the second gas mixture including at least one of a hydrocarbon containing gas, an optional oxygen containing gas and optionally an inert gas into the processing chamber to react with the etching by-products 320 and/or other related compounds from the substrate 301. Suitable examples of the hydrocarbon containing gas include methane ($CH_4$), ethane ($C_2H_6$), propane ($C_3H_8$), butane ($C_4H_{10}$), pentane ($C_5H_{12}$), hexane ($C_6H_{14}$), propene, ethylene, propylene, butylene, pentene, combinations thereof and the like. In a particular embodiment, the hydrocarbon containing gas is methane ($CH_4$). Suitable examples of the oxygen containing gas includes $O_2$, $N_2O$, $NO_2$, $H_2O$, $O_3$, $H_2O_2$ and the like. In a particular embodiment, the oxygen containing gas is $O_2$. The second gas mixture may be flowed into the chamber having a hydrocarbon containing gas at a rate between about 10 sccm to about 75 sccm and an oxygen containing gas at a rate between about 2 sccm to about 20 sccm. In a specific example, the second gas mixture includes $CH_4$ gas and $O_2$ gas supplied at a ratio between about 15:1 and about 3:1, such as about 10:1 and about 5:1.

While supplying the second etching gas mixture, an inert gas may also be supplied into the etching gas mixture to assist the profile control as needed. Examples of the inert gas supplied in the gas mixture include Ar, He, Ne, Kr, Xe or the like.

During the flash cleaning process, several process parameters may be regulated to control the flash cleaning process. During the first period of time that only has the second gas mixture supplied into the processing chamber without applied RF source/bias power, the first period of time may be controlled for a duration of between about 10 seconds and about 30 seconds, such as about 15 seconds. After the first period of time, the RF source and RF bias powers are then applied in the second gas mixture to form the plasma for a second period of time. The second period of time may have a duration of between about 2 seconds and about 20 seconds, such as about 10 seconds. In some embodiments, the second gas mixture may be supplied only for the first period of time (e.g., without RF source or bias power applied) such that the second period of time may be eliminated as needed. Process parameters may be regulated to be substantially the same during the first and the second period of time in the flash cleaning process only with or without the RF source/bias power applied.

During the flash cleaning process, a process pressure in the etch processing chamber 100 is regulated between about 4 mTorr to about 50 mTorr, for example, at about 5 mTorr. A RF source power may be applied at 500 Watts to about 2000 Watts, such as about 400 Watts, to maintain a plasma inside the etch processing chamber 100. Additional, a relatively low RF bias power less than 100 Watts, such as about less than 50 Watts, may be utilized during the flash cleaning process. A temperature of the substrate 301 is maintained between about 15 degrees Celsius to about 300 degrees Celsius, between about 5 degrees Celsius and about 50 degrees Celsius, for example about 35 degree Celsius or room temperature.

After the flash cleaning process is performed, the etching by-products 320 and/or other related compounds present on the substrate 301 may be then removed from the substrate 301.

Figure 3D:
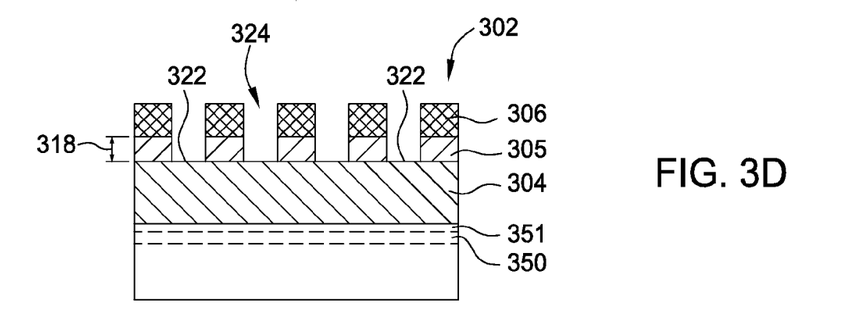

At block 208, a final interface etching process may be performed to etch the remaining portion of the hardmask layer 305 to form openings 324 in the hardmask layer 305 until a surface 322 of the underlying metal layer 304 is exposed to the feature 314, as shown in FIG. 3D. The portion of the features 314 defined at block 206 with reference to FIG. 3C is now further etched through until the underlying surface 322 of the metal layer 304 is exposed, defining the desired openings 324 formed in the hardmask layer 305.

In one embodiment, the final interface etching process may be performed by supplying a third gas mixture into the processing chamber. Gases selected to be supplied in the third gas mixture have a high selectively to the underlying metal layer 304 so as to provide a good etching stop control to terminate the interface etching process on the surface 322 of the metal layer 304 with minimum damage to the underlying metal layer 304.

In one embodiment, the third etching gas mixture selected to etch the remaining hardmask layer 305 includes a carbon-fluorine containing gas. The carbon-fluorine containing gas has a formula $C_xH_yF_z$, wherein x, y and z are integers ranging from 1 to 8, 0 to 18, and 2 to 16, respectively. Suitable examples of the carbon-fluorine containing gas include $CFH_3$, $CF_2H_2$, $CF_3H$, $C_2F_2H_4$, $C_2F_2H_6$, $CF_4$, $C_2F_6$, or the like. In a particular embodiment, the carbon-fluorine containing gas is $CF_4$. In another particular embodiment, the carbon-fluorine containing gas includes a gas mixture of $CF_3H$ and $CF_4$. In some embodiment, $O_2$ gas may also be supplied into the third gas mixture with the carbon-fluorine containing gas as needed.

It is believed that the carbon-fluorine containing gas may efficiently react with metal atoms, such as Ta or Ti elements, from the hardmask layer 305 without attacking the metal layer 304, such as copper elements, disposed under the hardmask layer 305. The carbon-fluorine containing used in the third gas mixture may have a high selectivity between the hardmask layer 305 and the metal layer with minimum etching by-product (e.g., polymer byproduct) generation, so as to maintain cleanness of the substrate surface after the openings 324, such as features, are formed in the hardmask layer 305. As such, numbers of the hydrogen atoms included in the carbon-fluorine containing gas may be maintained as small as possible to avoid polymer related product generation. In one example, the carbon-fluorine containing gas is a hydrogen free carbon-fluorine containing gas. In another embodiment, the carbon-fluorine containing gas supplied in the third gas mixture is $CF_4$ and/or $CF_3H$ with minimum H elements contained in the third gas mixture.

While supplying the third etching gas mixture, an inert gas may also be supplied into the etching gas mixture to assist the profile control as needed. Examples of the inert gas supplied in the gas mixture include Ar, He, Ne, Kr, Xe and the like.

In one embodiment, the carbon-fluorine containing gas supplied in the third etching gas mixture may be maintained at a flow rate by volume between about 5 sccm and about 500 sccm, such as about 150 sccm and about 250 sccm.

After the third etching gas mixture is supplied to the processing chamber mixture, RF source power is supplied to form a plasma from the third etching gas mixture therein. The RF source power may be supplied between about 500 Watts and about 2000 Watts, and at a frequency between about 400 kHz and about 13.56 MHz. RF bias power may also be supplied as needed. When utilized, RF bias power may be supplied at less than 100 Watts, such as between about 30 Watts and about 80 Watts, to reduce the impact of bias bombardment on the substrate. In one embodiment, the RF source power may be pulsed with a duty cycle between about 10 to about 95 percent at a RF frequency between about 500 Hz and about 10 kHz.

Several process parameters may also be controlled while supplying the etching gas mixture to perform the etching process. The pressure of the processing chamber may be controlled at between about 0.5 milliTorr and about 500 milliTorr, such as between about 4 milliTorr and about 30 milliTorr. A substrate temperature is maintained between about 15 degrees Celsius to about 300 degrees Celsius, such as between about 5 degrees Celsius and about 50 degrees Celsius, for example about 35 degree Celsius or room temperature. The third etching gas mixture for performing the etching process may be provided for between about 10 seconds and about 30 seconds to etch the remaining hardmask layer 305, which may be between about 10 Å and about 150 Å thick.

After the desired feature profile and/or the openings 324 of hardmask layer 305 are formed on the substrate 301, the remaining portions of the patterned mask layer 306 may be removed from the substrate 301, leaving the patterned hardmask layer 305 serving as a mask layer for patterning the metal layer 304 to form interconnection structures. A $H_2$ based ash process may be performed to remove remaining portions of the patterned mask layer 306. Other chemicals (e.g., $O_2$) may be eliminated due to risk of damage to the exposed metal layer. The $H_2$ based ash process may be performed for about 60 seconds and about 300 seconds with a RF source power about 1000 Watts and a RF bias power about 35 Watts as needed. The process pressure may be increased to about 50 mTorr during the $H_2$ based ash process.

Thus, methods for etching a hardmask layer disposed on a metal layer to form interconnection structure are provided. The etching process utilizes a three-stage etching process to etch features in a hardmask layer with high selectivity so as to maintain good feature/profile control while transferring features into the hardmask layer. The methods may advantageously provide the etching process with good feature control and etching efficiency with minimum damage to the underlying metal layer, thereby improving feature formation with desired dimension and profile formed in both the hardmask layer and the metal layer disposed on a substrate in applications for interconnection structures of semiconductor chips.

While the foregoing is directed to embodiments of the present disclosure, other and further embodiments of the disclosure may be devised without departing from the basic scope thereof, and the scope thereof is determined by the claims that follow.

What is claimed is:

1. A method of patterning a hardmask layer disposed on a metal layer formed on a substrate, comprising:
    supplying a first etching gas mixture comprising a first carbon-fluorine containing gas and a chlorine containing gas into a processing chamber to etch a portion of the hardmask layer disposed on the metal layer formed on the substrate;
    subsequently supplying a second etching gas mixture comprising a hydrocarbon gas without the first carbon-fluorine containing gas and the chlorine containing gas from the first etching gas mixture into the processing chamber for a first period of time without applying RF source power or RF bias power to clean the hardmask layer and the substrate disposed in the processing chamber; and
    subsequently supplying a third etching gas mixture that is different from the first etching gas mixture, the third etching gas mixture comprising a second carbon-fluorine containing gas to continue removing a remaining portion of the hardmask layer until a surface of the metal layer is exposed.

2. The method of claim 1, the metal layer is a copper layer.

3. The method of claim 1, wherein the hardmask layer is a Ta containing material or a Ti containing material.

4. The method of claim 1, wherein supplying the first etching gas mixture further comprising:
    etching the hardmask layer to a depth of between about 50 percent and about 90 percent of a total thickness of the hardmask layer.

5. The method of claim 1, further comprising:
    applying a RF source power or a RF bias power to the second gas mixture for a second period of time after the first period of time.

6. The method of claim 1, wherein the hydrocarbon gas supplied in the second gas mixture is selected from a group consisting of methane ($CH_4$), ethane ($C_2H_6$), propane ($C_3H_8$), butane ($C_4H_{10}$), pentane ($C_5H_{12}$), hexane ($C_6H_{14}$), propene, ethylene, propylene, butylene, pentene and combinations thereof.

7. The method of claim 1, wherein the hydrocarbon gas supplied in the second gas mixture is methane ($CH_4$).

8. The method of claim 1, wherein the first and the second carbon-fluorine containing gas supplied in the first and the third gas mixture is selected from a group consisting of $CFH_3$, $CF_2H_2$, $CF_3H$, $C_2F_2H_4$, $C_2F_2H_6$, $CF_4$ and $C_2F_6$.

9. The method of claim 8, wherein the first carbon-fluorine containing gas supplied in the first gas mixture is $CF_3H$.

10. The method of claim 8, wherein the second carbon-fluorine containing gas supplied in the third gas mixture is $CF_4$.

11. The method of claim 1, wherein the chlorine containing gas supplied in the first gas mixture is $Cl_2$ gas.

12. The method of claim 1 further comprising:
    performing an ashing process to remove etching byproducts from the substrate surface.

13. The method of claim 12, wherein the ashing process comprises supplying a $H_2$ gas into the processing chamber.

14. The method of claim 1, wherein the second etching gas mixture further comprises an oxygen containing gas.

15. The method of claim 14, wherein the hydrocarbon gas and the oxygen containing gas is supplied at a ratio between about 10:1 and about 5:1.

16. A method of patterning a hardmask layer disposed on a metal layer formed on a substrate, comprising:
    performing an etching break-through process to etch a depth of the hardmask layer disposed on the metal layer formed on the substrate, wherein the depth of the hardmask layer is between about 50 percent and about 90 percent of a total thickness of the hardmask layer, wherein the hardmask layer is a Ta containing material or a Ti containing material, wherein the hardmask layer is etched by a chlorine free carbon-fluorine containing gas;
    subsequently performing a flash cleaning process to remove etching residuals from the substrate without the chlorine free carbon-fluorine containing gas and without applying RF source power or RF bias power during the flash cleaning process; and
    subsequently performing an interface cleaning process to continue etching a remaining portion of the hardmask layer from the substrate, wherein the interface cleaning process uses a first gas mixture that is different from a second gas mixture supplied in the etching break-through process.

17. The method of claim 16, wherein the interface cleaning process is performed by supplying the first etching gas mixture including a hydrogen free carbon-fluorine containing gas.

18. The method of claim 16, wherein the flash cleaning process comprises supplying a gas mixture including a hydrocarbon gas and an oxygen containing gas supplied at a ratio between about 10:1 and about 5:1.

19. A method of patterning a hardmask layer disposed on a metal layer formed on a substrate, comprising:
    performing an etching break-through process by supplying a first gas mixture to etch a depth of the hardmask layer disposed on the metal layer formed on the substrate, wherein the depth of the hardmask layer is between about 50 percent and about 90 percent of a total thickness of the hardmask layer, the first gas mixture including a carbon-fluorine containing gas and a chlorine containing gas;
    subsequently performing a flash cleaning process to remove etching residuals from the substrate by supplying a second gas mixture including a hydrocarbon gas without the carbon-fluorine containing gas and the chlorine containing gas from the first gas mixture and without applying RF source power or RF bias power; and
    subsequently performing an interface cleaning process to continue etching a remaining portion of the hardmask layer from the substrate by supplying a third etching gas mixture including a hydrogen free carbon-fluorine containing gas while maintaining the substrate temperature at about 90 degrees Celsius.

* * * * *